(12) United States Patent
Shimoji et al.

(10) Patent No.: US 12,328,108 B2
(45) Date of Patent: Jun. 10, 2025

(54) PIEZOELECTRIC ELEMENT, METHOD OF MANUFACTURING THE SAME, SURFACE ACOUSTIC WAVE ELEMENT, AND PIEZOELECTRIC THIN FILM RESONANCE ELEMENT

(71) Applicant: ROHM CO., LTD., Kyoto (JP)

(72) Inventors: Noriyuki Shimoji, Kyoto (JP); Tomohiro Date, Kyoto (JP); Norikazu Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 940 days.

(21) Appl. No.: 17/474,221

(22) Filed: Sep. 14, 2021

(65) Prior Publication Data

US 2022/0094326 A1    Mar. 24, 2022

(30) Foreign Application Priority Data

Sep. 18, 2020  (JP) ................. 2020-157233

(51) Int. Cl.
  *H03H 9/02* (2006.01)
  *C30B 25/18* (2006.01)
  *C30B 29/40* (2006.01)
  *H03H 3/08* (2006.01)
  *H03H 9/25* (2006.01)

(52) U.S. Cl.
  CPC ......... *H03H 9/02543* (2013.01); *C30B 25/18* (2013.01); *C30B 29/403* (2013.01); *H03H 3/08* (2013.01); *H03H 9/25* (2013.01)

(58) Field of Classification Search
  CPC .. H10N 30/076; H10N 30/704; H10N 30/853; H03H 9/02574; H03H 9/02031; H03H 9/25; H03H 9/02543; H03H 3/08; C30B 29/403; C30B 25/18
  See application file for complete search history.

(56) References Cited

U.S. PATENT DOCUMENTS 10,700,665 B2 *  6/2020  Then ..................... H03H 3/02
2015/0033520 A1   2/2015  Riaziat et al.

FOREIGN PATENT DOCUMENTS

| CN | 101017864 A  * | 8/2007 |
| CN | 106011759 A  * | 10/2016 |
| EP | 0669412 A1 | 8/1995 |
| EP | 1100196 A2 | 5/2001 |
| JP | S62141720 A | 6/1987 |
| JP | H07237998 A | 9/1995 |
| JP | 2002-344279 A | 11/2002 |
| JP | 2006033434 A | 2/2006 |
| JP | 2007043498 A | 2/2007 |
| JP | 2008054258 A | 3/2008 |
| JP | 2009190965 A | 8/2009 |

(Continued)

OTHER PUBLICATIONS

Machine Translation of CN106011759 (Year: 2016).*

(Continued)

*Primary Examiner* — J. San Martin
(74) *Attorney, Agent, or Firm* — Rabin & Berdo, P.C.

(57) ABSTRACT

A piezoelectric element includes a single crystal piezoelectric film, wherein the single crystal piezoelectric film includes an aluminum nitride film and wherein a full width at half maximum at (002) diffraction peak of the aluminum nitride film is smaller than 1.00 degree.

18 Claims, 10 Drawing Sheets

(56) References Cited

FOREIGN PATENT DOCUMENTS

| JP | 2011139215 A | 7/2011 |
|---|---|---|
| WO | 2017095437 A1 | 6/2017 |

OTHER PUBLICATIONS

Chubachi Y et al., "Reflection high energy electron diffraction and X-ray studies of AlN films grown on Si(111) and Si (001) by organometallic chemical vapour deposition", Thin Solid Films, vol. 122, No. 3, Dec. 21, 1984, pp. 259-270, XP025730256.
European Search Report in the counterpart of European Application No. 21196617.1 dated Feb. 21, 2022.
Mingyo Park et al., "Epitaxial Aluminum Scandium Nitride Super High Frequency Acoustic Resonators", Journal of Microelectromechanical Systems, vol. 29 No. 4, Jun. 22, 2020, pp. 490-498, XP011801941.
Saxler A et al., "High quality aluminum nitride epitaxial layers grown on sapphire substrates", applied Physics Letters, vol. 64, No. 3, Jan. 17, 1994, pp. 339-341, XP002256572.
European Office Action dated May 7, 2024, in the counterpart European Patent Application No. 21196617.1.
Japanese Office Action dated Apr. 2, 2024, in the counterpart Japanese patent application No. 2020-157233.

\* cited by examiner

PIEZOELECTRIC ELEMENT, METHOD OF MANUFACTURING THE SAME, SURFACE ACOUSTIC WAVE ELEMENT, AND PIEZOELECTRIC THIN FILM RESONANCE ELEMENT

CROSS-REFERENCE TO RELATED APPLICATION

This application is based upon and claims the benefit of priority from Japanese Patent Application No. 2020-157233, filed on Sep. 18, 2020, the entire contents of which are incorporated herein by reference.

TECHNICAL FIELD

The present disclosure relates to a piezoelectric element, a method of manufacturing the same, a surface acoustic wave element, and a piezoelectric thin film resonance element.

BACKGROUND

Portable devices such as smartphones for which miniaturization and power saving are strongly required are rapidly expanding in use, and in wireless communication systems for portable devices, devices that utilize high frequencies in the GHz band are being actively developed. In a high-frequency circuit used in these wireless communication systems, an IF (Intermediate Frequency) filter and an RF (Radio Frequency) filter are used in an analog circuit part.

The above-mentioned filters are used to pass only a signal of a desired frequency band and block signals of other frequencies. For example, the RF filter includes a plurality of resonance elements, and a desired filter band is formed by a ladder circuit in which the resonance elements are connected in a ladder shape.

A specific example of the filter may include a SAW filter which is a filter in which a surface acoustic wave resonator (SAWR) as a piezoelectric element is used. The SAW filter is approaching the limit of improvement in characteristics as the frequency to be used is increased. As an alternative to the SAW filter, an FBAR (Film Bulk Acoustic Resonator) filter, which is a filter where a piezoelectric thin film resonance element (also referred to as an FBAR) as a piezoelectric element is used, has been developed.

The SAW filter and the FBAR filter include a piezoelectric film. In the SAW filter, a comb-shaped electrode (also referred to as an interdigital transducer (IDT)) is formed on the surface of the piezoelectric film, and a band of the filter is formed by using the resonance characteristics of a surface acoustic wave excited by the IDT. In the FBAR filter, the piezoelectric film is sandwiched between upper and lower electrodes, and longitudinal vibration in the film thickness direction is used.

Piezoelectric film materials for the piezoelectric element may include aluminum nitride (AlN), zinc oxide (ZnO), lithium niobate ($LiNbO_3$), lithium tantalate ($LiTaO_3$), and lead zirconate titanate ($Pb(Zr,Ti)O_3$:PZT), and the like. A filter in the high-frequency band is required to have a wide bandwidth, a high propagation speed, and temperature stability, and the piezoelectric film is required to use a material having a high piezoelectric constant, a high propagation speed, and a small temperature coefficient.

Regarding the above requirements, it is known that aluminum nitride is preferable as a piezoelectric film material for a piezoelectric element of a filter in a high-frequency band.

In the related art, it is known that a piezoelectric thin film resonator having high characteristics and high performance may be obtained by adding an alkaline earth metal and/or a rare earth element to an aluminum nitride thin film.

However, although aluminum nitride formed by a sputtering method may be easily thinned and thus tends to have a high frequency, it has many crystal grain boundaries. A crystal grain boundary is a boundary among a large number of crystals (polycrystals) existing in a thin film and is a lattice defect in which atoms are arranged discontinuously. Although the grain boundary, which is an origin of various functions of a material due to its specific atomic arrangement, exists only in an extremely small region with a width of several nanometers, it may often determine an overall performance of materials and elements. For example, the crystal grain boundary may greatly reduce a thermal conductivity and a vibration propagation of a material.

SUMMARY

An embodiment of the present disclosure provides a high-performance piezoelectric element that operates stably in a high-frequency region, has a high piezoelectric property, and has small temperature dependence. Further, another embodiment of the present disclosure provides a surface acoustic wave element including the piezoelectric element. Further, another embodiment of the present disclosure provides a piezoelectric thin film resonance element including the piezoelectric element. Further, another embodiment of the present disclosure provides a method of manufacturing the piezoelectric element.

According to an embodiment of the present disclosure, there is provided a piezoelectric element in which a single crystal piezoelectric film including an aluminum nitride film that is highly oriented on a c-axis is used. Aspects of the present embodiment are as follows.

According to an aspect of the present embodiment, there is provided a piezoelectric element including: a single crystal piezoelectric film, wherein the single crystal piezoelectric film includes an aluminum nitride film, and a full width at half maximum at the (002) diffraction peak of the aluminum nitride film is smaller than 1.00 degree.

According to another aspect of the present embodiment, there is provided a piezoelectric element including: a base substrate; and a single crystal piezoelectric film on the base substrate, wherein the single crystal piezoelectric film includes an aluminum nitride film, and a full width at half maximum at the (002) diffraction peak of the aluminum nitride film is smaller than 1.00 degree.

According to another aspect of the present embodiment, there is provided a surface acoustic wave element including the above-mentioned piezoelectric element.

According to another aspect of the present embodiment, there is provided a piezoelectric thin film resonance element including the above-mentioned piezoelectric element.

According to another aspect of the present embodiment, there is provided a method of manufacturing a piezoelectric element, including: forming a single crystal piezoelectric film including an aluminum nitride film on a base substrate, wherein the aluminum nitride film is formed by one selected from the group of a CVD method and a MBE method, and a full width at half maximum at the (002) diffraction peak of the aluminum nitride film is smaller than 1.00 degree.

DETAILED DESCRIPTION

Figure 1:
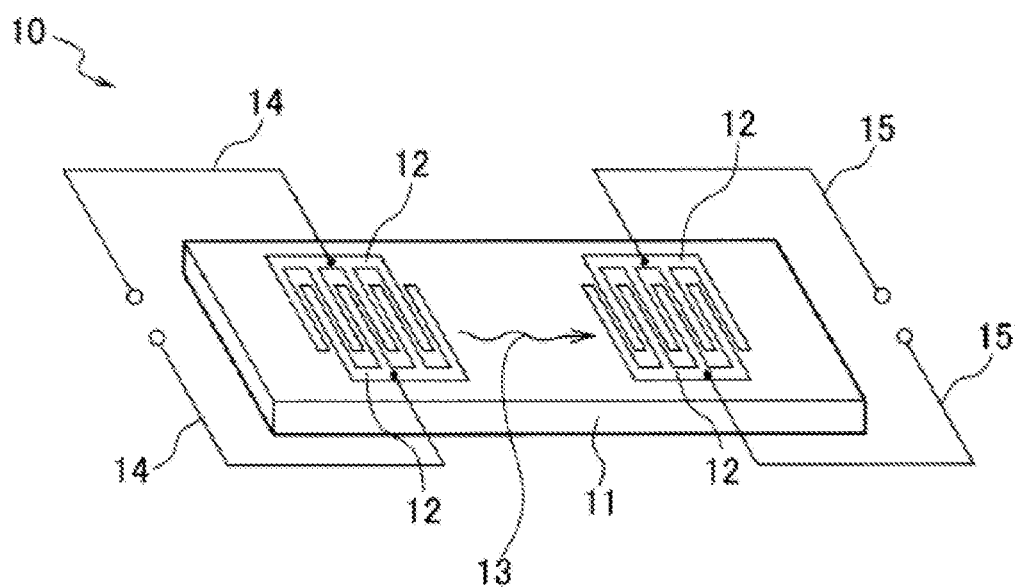
FIG. 1 is a view to explain a basic structure of a surface acoustic wave element.

Embodiments of the present disclosure will be now described with reference to the drawings. In the description of the drawings described below, the same or similar parts are denoted by the same or similar reference numerals. However, it should be noted that the drawings are schematic and a relationship between a thickness and a planar dimension of each component is different from the actual one. Therefore, a specific thickness and dimension should be determined in consideration of the following description. In addition, it goes without saying that parts of the drawings having different dimensional relationships and ratios are included.

Further, the embodiments shown below exemplify apparatuses and methods to embody technical ideas, and do not specify a material, a shape, a structure, an arrangement, and the like of each component. The present embodiment may be modified in various ways within the scope of the claims.

An aspect of the present embodiment is as follows.

<1> A piezoelectric element including: a single crystal piezoelectric film, wherein the single crystal piezoelectric film includes an aluminum nitride film, and wherein a full width at half maximum at (002) diffraction peak of the aluminum nitride film is smaller than 1.00 degree.

<2> A piezoelectric element including: a base substrate; and a single crystal piezoelectric film on the base substrate, wherein the single crystal piezoelectric film includes an aluminum nitride film, and wherein a full width at half maximum at (002) diffraction peak of the aluminum nitride film is smaller than 1.00 degree.

<3> The piezoelectric element of <2>, wherein the base substrate is one selected from the group of a silicon (111) substrate, an SOI substrate in which an active layer is silicon (111), a SiC substrate, and a sapphire substrate.

<4> The piezoelectric element of any one of <1> to <3>, wherein the full width at half maximum at (002) diffraction peak of the aluminum nitride film is smaller than 0.36 degrees.

<5> The piezoelectric element of any one of <1> to <4>, wherein a film thickness of the aluminum nitride film is 70 nm or more.

<6> The piezoelectric element of any one of <1> to <5>, wherein a film thickness of the aluminum nitride film is 100 nm or more.

<7> The piezoelectric element of any one of <1> to <6>, wherein the single crystal piezoelectric film is a laminated film, wherein the laminated film includes a thin film on the aluminum nitride film, and wherein the thin film is at least one selected from the group of a gallium nitride film, an aluminum gallium nitride film, an aluminum nitride film containing scandium, a silicon oxide film, and a thin film having a negative linear expansion coefficient.

<8> A surface acoustic wave element including the piezoelectric element of any one of <1> to <7>.

<9> A piezoelectric thin film resonance element including the piezoelectric element of any one of <1> to <7>.

<10> A method of manufacturing a piezoelectric element, including: forming a single crystal piezoelectric film including an aluminum nitride film on a base substrate, wherein the aluminum nitride film is formed by one selected from the group of a CVD method and a MBE method, and wherein a full width at half maximum at (002) diffraction peak of the aluminum nitride film is smaller than 1.00 degree.

<11> The method of <10>, wherein the base substrate is one selected from the group of a silicon (111) substrate, an SOI substrate in which an active layer is silicon (111), a SiC substrate, and a sapphire substrate.

<12> The method of <10> or <11>, wherein the aluminum nitride film is formed by a MOCVD method.

<13> The method of <12>, wherein the aluminum nitride film is formed by the MOCVD method in which trimethylaluminum and ammonia are used, the base substrate is set at 900 to 1,100 degrees C., and a pressure at the time of film formation is 10 to 15 kPa.

<14> The method of any one of <10> to <13>, wherein the full width at half maximum at (002) diffraction peak of the aluminum nitride film is smaller than 0.36 degrees.

<15> The method of any one of <10> to <14>, wherein a film thickness of the aluminum nitride film is 70 nm or more.

<16> The method of any one of <10> to <15>, wherein a film thickness of the aluminum nitride film is 100 nm or more.

<17> The method of any one of <10> to <16>, wherein the single crystal piezoelectric film is a laminated film, wherein the laminated film forms a thin film on the aluminum nitride film, and wherein the thin film is at least one selected from the group of a gallium nitride film, an aluminum gallium nitride film, an aluminum nitride film containing scandium, a silicon oxide film, and a thin film having a negative linear expansion coefficient.

<18> The method of any one of <10> to <17>, wherein the base substrate is peeled off by at least one selected from the group of etching, grinding, and polishing.

<Piezoelectric Element>

A piezoelectric element according to an embodiment of the present disclosure will be described.

The piezoelectric element of the embodiment includes at least a single crystal piezoelectric film, and specific use of the piezoelectric element is not particularly limited. For example, the piezoelectric element may be used for a SAW filter, an FBAR filter, and the like.

Here, a surface acoustic wave element used in the SAW filter and a piezoelectric thin film resonance element used in the FBAR filter will be described with reference to the drawings.

(Surface Acoustic Wave Element)

FIG. 1 shows an example of a basic structure of a surface acoustic wave element including a piezoelectric element of an embodiment of the present disclosure.

The surface acoustic wave element 10 includes a piezoelectric film 11, electrodes 12 on the piezoelectric film 11, a wiring 14 electrically connected to one electrode 12, and a wiring 15 electrically connected to another electrode 12. Each of the electrodes 12 may be a comb-shaped electrode (IDT). When a signal is input from the outside to the one electrode 12 (IDT) formed on the surface of the piezoelectric film 11 via the wiring 14, a surface acoustic wave 13 excited by the one electrode 12 propagates through the another electrode 12 and a signal is output to the outside via the wiring 15.

In the present disclosure and the like, "being electrically connected" includes a case of being connected via "something having some electrical action." Here, the "something having some electrical action" is not particularly limited as long as it enables an exchange of an electric signal between connection targets. For example, the "something having some electrical action" includes elements having various functions, such as an electrode, a wiring, a switching element, a resistance element, an inductor, a capacitive element, and the like.

The piezoelectric film 11 is a single crystal piezoelectric film, which includes an aluminum nitride film, and a full width at half maximum (FWHM) at (002) diffraction peak of the aluminum nitride film may be smaller than 1.00 degree, specifically smaller than 0.50 degrees, more specifically smaller than 0.36 degrees. As the FWHM at (002) diffraction peak of the aluminum nitride film decreases, an orientation increases.

The above-mentioned piezoelectric film 11 includes an aluminum nitride film having a crystal region that is highly oriented to a c-axis. An aluminum nitride film having a c-axis oriented-crystal region of a single crystal having high orientation and high crystallinity has few crystal grain boundaries. Therefore, when the piezoelectric film 11 includes the aluminum nitride film having the crystal region that is highly oriented to the c-axis, it is possible to suppress an attenuation of a surface acoustic wave due to the crystal grain boundaries. Therefore, it is possible to obtain a surface acoustic wave element 10 that operates stably in a high-frequency region, has high piezoelectricity such as a low loss, a wide bandwidth, and a high propagation speed, and has a small temperature dependence.

Further, a resonance frequency of the surface acoustic wave element 10 (filter) and the like is determined by a distance between comb teeth of the electrode 12 (IDT).

Further, from the viewpoint of high orientation, the film thickness of the aluminum nitride film contained in the piezoelectric film 11 may be, for example, 70 nm or more, specifically 100 nm or more. The piezoelectric film 11 may be a laminated film. Specifically, the piezoelectric film 11 may have a laminated structure of an aluminum nitride film and one thin film selected from the group of a gallium nitride film, an aluminum gallium nitride film, an aluminum nitride film containing scandium, a silicon oxide film, and a thin film having a negative linear expansion coefficient on the aluminum nitride film. The film thickness of the thin film formed on the aluminum nitride film is not particularly limited as long as it does not hinder the high piezoelectricity and temperature dependence of the aluminum nitride film.

Since the above-mentioned gallium nitride film, aluminum gallium nitride film, and aluminum nitride film containing scandium are thin films having high piezoelectricity, it is possible to obtain a surface acoustic wave element 10 having higher piezoelectricity by laminating the above-described thin films with the aluminum nitride film having a crystal region that is highly oriented to the c-axis.

Further, by laminating the silicon oxide film having excellent temperature stability and the thin film having the negative linear expansion coefficient with the aluminum nitride film having a crystal region that is highly oriented to the c-axis, it is possible to obtain a surface acoustic wave element 10 having a smaller temperature dependence.

Examples of materials having the negative linear expansion coefficient may include, but are not limited to, tungsten oxides such as $Sc_2W_3O_{12}$ (linear expansion coefficient near 25 degrees C.: $-2.2 \times 10^{-6}$/degrees C.), $Lu_2W_3O_{12}$ (linear expansion coefficient near 25 degrees C.: $-6.8 \times 10^{-6}$/degrees C.), and $ZrW_2O_8$ (linear expansion coefficient near 25 degrees C.: $-8.7 \times 10^{-6}$/degrees C.); manganese nitrides such as $Mn_3XN$ (X is Cu—Sn, Zn—Sn, etc., and maximum linear expansion coefficient: $-30 \times 10^{-6}$/degrees C.); aluminum oxides such as $Al_2O_3 \cdot TiO_2$ (linear expansion coefficient: $-0.8 \times 10^{-6}$/degrees C.) and $Li_2O \cdot Al_2O_3 \cdot nSiO_2$ (linear expansion coefficient: $-0.4 \times 10^{-6}$/degrees C.); $LaCuFe_4O_{12}$ (having a huge negative linear expansion coefficient of $-1\%$ from the linear expansion coefficient before the phase transition due to a phase transition near 120 degrees C.); ruthenium oxides having a layered perovskite structure such as $Ca_2RuO_{3.74}$ (linear expansion coefficient at $-138$ to $72$ degrees C.: $-115 \times 10^{-6}$/degrees C.); and samarium yttrium sulfides, which are rare earth sulfides, such as $Sm_{0.78}Y_{0.22}S$ (linear expansion coefficient at $-173$ to $42$ degrees C.: $-65 \times 10^{-6}$/degrees C.).

Further, the piezoelectric film 11 may be a laminated film including the aluminum nitride film having a crystal region that is highly oriented to the c-axis, the thin film having high piezoelectricity (gallium nitride film, aluminum gallium nitride film, or aluminum nitride film containing scandium), and the thin film having excellent temperature stability (silicon oxide film or the thin film having a negative linear expansion coefficient). By using the piezoelectric film 11 having the above-described configuration, it is possible to obtain a surface acoustic wave element 10 having higher piezoelectricity and smaller temperature dependence.

The aluminum nitride film that is highly oriented to the c-axis may be formed on a base substrate by a chemical vapor deposition (CVD) method or a molecular beam epitaxy (MBE) method. From the viewpoint of more highly orienting the crystal to the c-axis, the aluminum nitride film may be formed by using a metal organic chemical vapor deposition (MOCVD) method.

The aluminum nitride film that is highly oriented to the c-axis may be formed by the MOCVD method in which, for example, a nitrogen precursor gas and a group III element precursor gas are used as precursor gases, the base substrate is heated to 900 to 1,100 degrees C., the pressure at the time of film formation is 10 to 15 kPa, a film formation rate is 7 to 10 nm/min, and a V/III flow rate ratio (a rate of a flow rate ratio of the nitrogen precursor gas to a flow rate ratio of the group III element precursor gas) is 230 to 270.

Examples of the above-mentioned nitrogen precursor gas may include ammonia and the like. Examples of the group III element precursor gas may include organometallic gases such as trimethylgallium (TMG), triethylgallium (TEG), trimethylindium (TMI), and trimethylaluminum (TMA). The organometallic gas may supplied into a film-forming chamber in a state where it is mixed with a nitrogen gas or hydrogen gas as a carrier gas. In addition to these precursor gases, a nitrogen gas or a hydrogen gas may be separately supplied into the film-forming chamber. Ammonia and trimethylaluminum may be used as the precursor gas.

Further, since the crystallinity of the base substrate contributes to the crystallinity of the aluminum nitride film formed on the base substrate, a base substrate having high crystallinity is used. The base substrate functions as a seed crystal of the aluminum nitride film, and the seed crystal may be used as a nucleus in crystal growth to form the aluminum nitride film having a crystal region that is highly oriented to the c-axis.

Examples of the base substrate may include a silicon (111) substrate, an SOI substrate in which an active layer is silicon (111), a SiC substrate, a sapphire substrate, and the like. Since these substrates have the function as the above-mentioned seed crystal, it is possible to form the aluminum nitride film having a crystal region that is highly oriented to the c-axis.

Further, the following conditions may be applied because the aluminum nitride film having a crystal region that is highly oriented to the c-axis is easily obtained.

First, impurities in a gas used for film formation are reduced. By reducing the impurities contained in the film formation, it is possible to suppress a collapse of the crystal state due to the impurities, and it becomes easy to obtain the aluminum nitride film having the crystal region that is highly oriented to the c-axis.

Next, in a case where an upper surface of the base substrate has fine irregularities which may be a factor that inhibits crystal growth, by flattening the upper surface of the base substrate by a chemical mechanical polishing (CMP) method or the like, it becomes easy to obtain the aluminum nitride film having the crystal region that is highly oriented to the c-axis.

Further, after forming the piezoelectric film 11, the base substrate may be peeled from the piezoelectric film 11 by etching, grinding, polishing or the like, and another structure such as a substrate may be attached to the peeled surface of the piezoelectric film 11. A piezoelectric element such as a surface acoustic wave element including the piezoelectric film 11 may be easily mounted on another structure.

Examples of the electrode 12 may include a laminated film of molybdenum, tungsten, platinum, and titanium, a laminated film of aluminum, gold, and chromium, and the like, which are formed by the sputtering method or the CVD method.

Examples of the wiring 14 and the wiring 15 may include copper, silver, palladium, iridium, platinum, gold, and the like, which are formed by the sputtering method or a vacuum vapor deposition method.

According to the embodiment of the present disclosure, by using the aluminum nitride film having the crystal region that is highly oriented to the c-axis for the piezoelectric film, it is possible to provide a piezoelectric element such as a high-performance surface acoustic wave element that operates stably in a high-frequency region, has high piezoelectricity, and has a small temperature dependence.

(Piezoelectric Thin Film Resonance Element)

Figure 2:
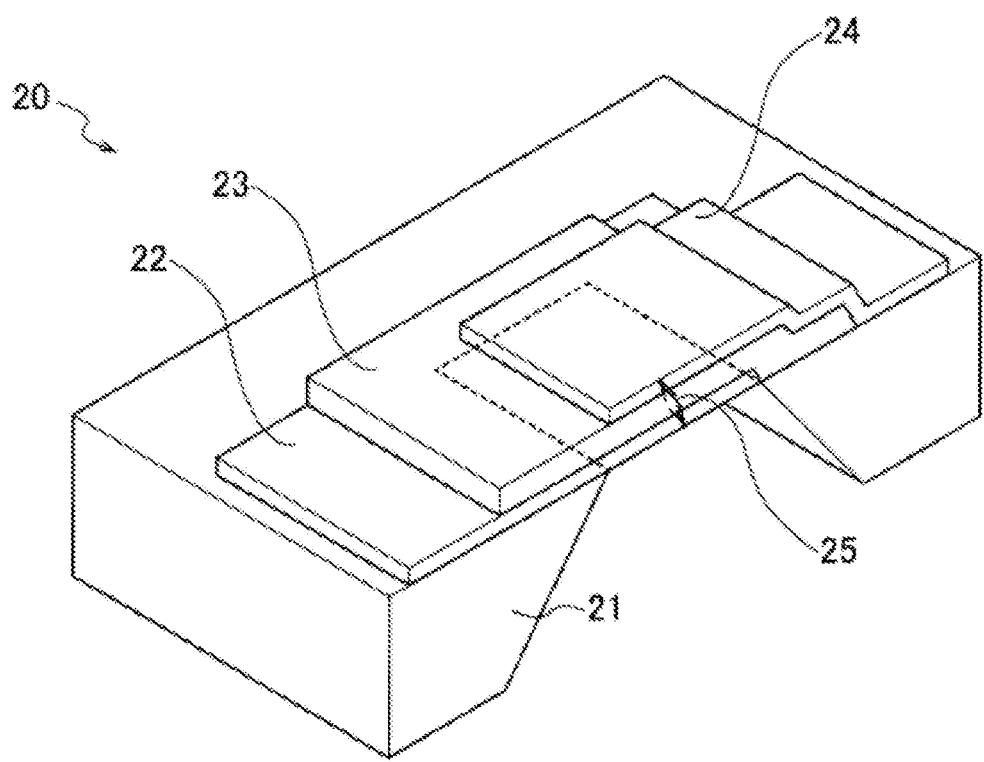
FIG. 2 is a view to explain a basic structure of a piezoelectric thin film resonance element.

FIG. 2 shows an example of a basic structure of a piezoelectric thin film resonance element including the piezoelectric element of the embodiment of the present disclosure.

The piezoelectric thin film resonance element 20 includes a substrate 21, a lower electrode 22 on the substrate 21, a piezoelectric film 23 on the substrate 21 to cover a portion of the lower electrode 22, and an upper electrode 24 on the piezoelectric film 23. The piezoelectric film 23 is sandwiched between the lower electrode 22 and the upper electrode 24, and these are collectively referred to as a piezoelectric laminated structure. In the piezoelectric thin film resonance element 20, the piezoelectric film 23 causes longitudinal vibration in response to an high-frequency signal that is inputted, and the vibration causes resonance in the thickness direction of the piezoelectric film 23, resulting in resonance vibration (a bulk acoustic wave 25).

The substrate 21 is a substrate to support the piezoelectric laminated structure (including the lower electrode 22, the piezoelectric film 23, and the upper electrode 24), and a lower part of the substrate 21 where the piezoelectric laminated structure is formed is hollow to freely vibrate the piezoelectric film 23 (the piezoelectric laminated structure).

Examples of the substrate 21 may include a silicon (111) substrate, an SOI substrate in which an active layer is silicon (111), a SiC substrate, a sapphire substrate, and the like.

As a method of forming the hollow in the substrate 21, an etching method or the like may be used.

The lower electrode 22 and the upper electrode 24 are electrodes configured to apply an electric field to the piezoelectric film 23. Examples of the lower electrode 22 and the upper electrode 24 may include a laminated film of molybdenum, tungsten, platinum, and titanium, a laminated film of aluminum, gold, and chromium, and the like, which are formed by the sputtering method or the CVD method.

The piezoelectric film 23 is a single crystal piezoelectric film like the above-described piezoelectric film 11, and the single crystal piezoelectric film includes an aluminum nitride film having a crystal region that is highly oriented to the c-axis. Further, the piezoelectric film 23 may be a laminated film like the above-described piezoelectric film 11. The description of the piezoelectric film 11 may be invoked for details of a method of forming the piezoelectric film 23 and the like.

The aluminum nitride film having the c-axis oriented crystal region of a single crystal having high orientation and high crystallinity has few crystal defects and grain boundaries. Therefore, when the piezoelectric film 23 includes the aluminum nitride film having the crystal region that is highly oriented to the c-axis, it is possible to suppress attenuation of a bulk acoustic wave due to crystal defects and crystal grain boundaries. Therefore, it is possible to obtain a piezoelectric thin film resonance element 20 that operates stably in the high-frequency region, has high piezoelectricity such as a low loss, a wide bandwidth, and a high propagation speed, and has a small temperature dependence.

According to the embodiment of the present disclosure, by using the aluminum nitride film having a crystal region that is highly oriented to the c-axis for the piezoelectric film, it is possible to provide a piezoelectric element such as a high-performance piezoelectric thin film resonance element that operates stably in the high frequency region, has high piezoelectricity, and has a small temperature dependence.

Next, an example of a specific structure of the above-described surface acoustic wave element and piezoelectric thin film resonance element will be described with reference to the drawings.

(Surface Acoustic Wave Element 100A)

Figure 3:
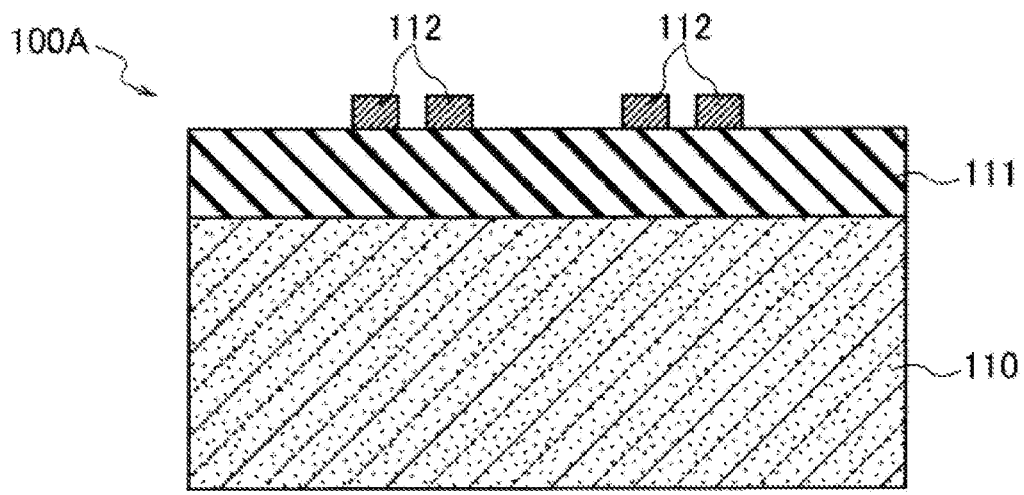
FIG. 3 is a cross-sectional view to explain a surface acoustic wave element 100A according to an embodiment of the present disclosure.

A surface acoustic wave element 100A shown in FIG. 3 includes a base substrate 110, a piezoelectric film 111 on the base substrate 110, and comb-shaped electrodes 112 on the piezoelectric film 111. For the base substrate 110, the description of the base substrate described in the above-described surface acoustic wave element may be invoked. The piezoelectric film 111 includes an aluminum nitride film having a crystal region that is highly oriented to the c-axis. The base substrate 110 having high crystallinity functions as a seed crystal of the aluminum nitride film, and the seed crystal may be used as a nucleus for crystal growth to form the aluminum nitride film having the crystal region that is highly oriented to the c-axis. The description of the piezoelectric film 11 may be invoked for details of physical characteristics of the piezoelectric film 111, a method of forming the piezoelectric film 111, and the like. The description of the electrode 12 may be invoked for the comb-shaped electrode 112.

The base substrate 110 has a linear expansion coefficient smaller than that of the piezoelectric film 111. Therefore, the surface acoustic wave element 100A including the base substrate 110 and the piezoelectric film 111 has excellent temperature stability. By not only the action of the piezoelectric film 111 including the aluminum nitride film having the crystal region that is highly oriented to the c-axis, but also the action of the base substrate 110 having a small linear expansion coefficient, it is possible to obtain the surface acoustic wave element 100A having high piezoelectricity and smaller temperature dependence.

(Surface Acoustic Wave Element 100B)

Figure 4:
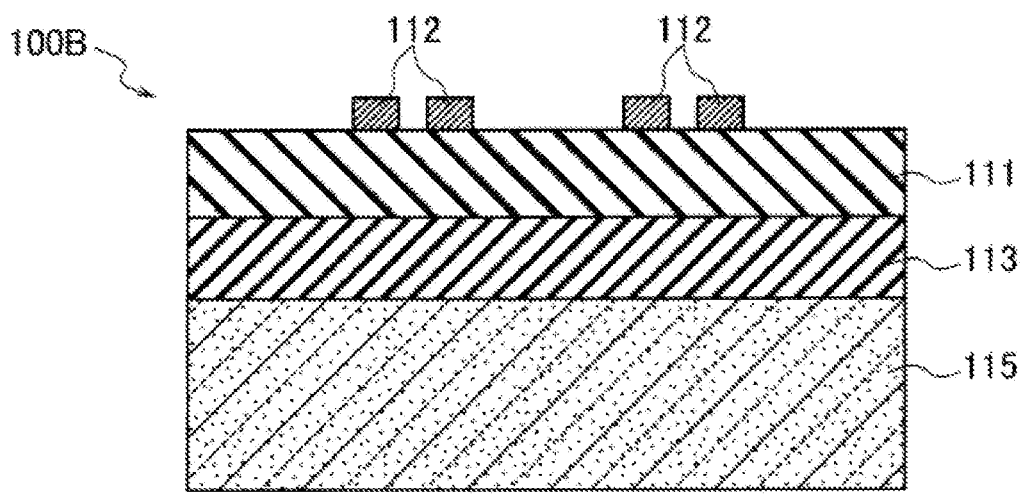
FIG. 4 is a cross-sectional view to explain a surface acoustic wave element 100B according to an embodiment of the present disclosure.

A surface acoustic wave element 100B shown in FIG. 4 includes a substrate 115, a silicon oxide film 113 on the substrate 115, a piezoelectric film 111 on the silicon oxide film 113, and a comb-shaped electrode 112 on the piezoelectric film 111. A difference between the surface acoustic wave element 100B and the surface acoustic wave element 100A is that the substrate 115 on which the silicon oxide film 113 is formed is provided instead of the base substrate 110.

The surface acoustic wave element 100B may be manufactured by forming the piezoelectric film 111 by using the base substrate 110 in the surface acoustic wave element 100A, peeling the base substrate 110 from the piezoelectric film 111 by etching, grinding, polishing, or the like, and attaching the substrate 115 on which the silicon oxide film 113 is formed to the peeled surface of the piezoelectric film 111.

The silicon oxide film 113 has a small linear expansion coefficient. Therefore, the surface acoustic wave element 100B including the silicon oxide film 113 and the piezoelectric film 111 has excellent temperature stability. By not only the action of the piezoelectric film 111 including the aluminum nitride film having the crystal region that is highly oriented to the c-axis, but also the action of the silicon oxide film 113 having a small linear expansion coefficient, it is possible to obtain the surface acoustic wave element 100B having high piezoelectricity and smaller temperature dependence.

(Surface Acoustic Wave Element 100C)

Figure 5:
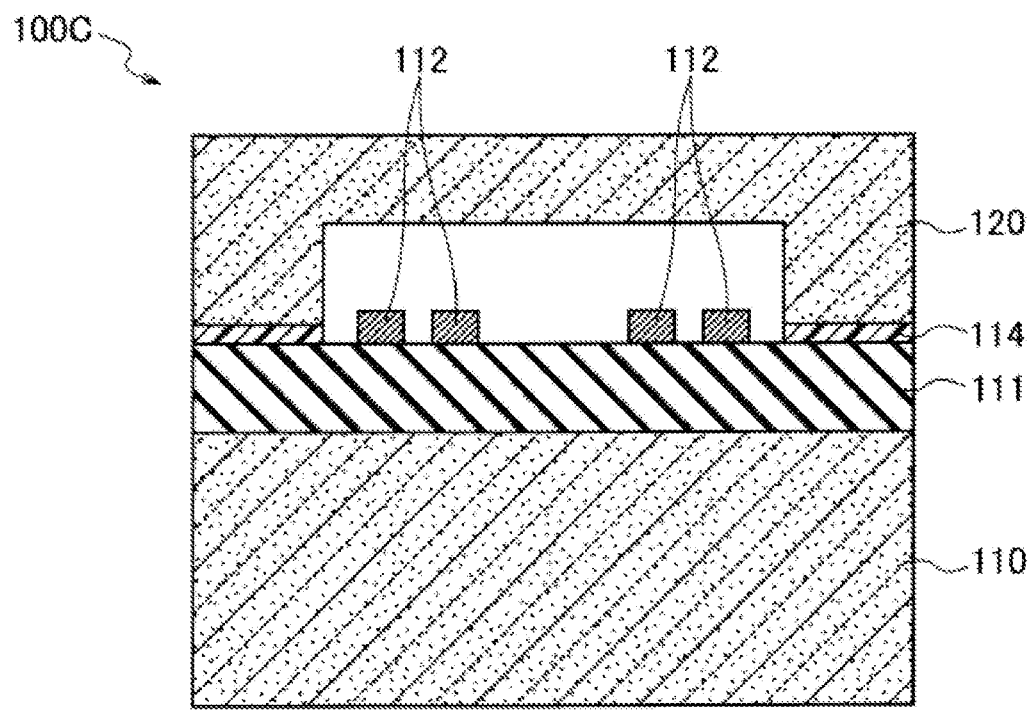
FIG. 5 is a cross-sectional view to explain a surface acoustic wave element 100C according to an embodiment of the present disclosure.

A surface acoustic wave element 100C shown in FIG. 5 includes a base substrate 110, a piezoelectric film 111 on the base substrate 110, a comb-shaped electrode 112 on the piezoelectric film 111, an adhesive 114 on the piezoelectric film 111, and a substrate 120 on the adhesive 114. A difference between the surface acoustic wave element 100C and the surface acoustic wave element 100A is that the adhesive 114 and the substrate 120 are further provided.

The substrate 120 functions as an auxiliary substrate. The substrate 120 is formed with a hollow and is adhered to the piezoelectric film 111 via the adhesive 114. An atmosphere of the hollow formed in the substrate 120 is filled with vacuum or an inert gas such as nitrogen. Further, the substrate 120 does not come into contact with the comb-shaped electrode 112. Examples of the substrate 120 may include a silicon substrate and a glass substrate. The adhesive 114 is not particularly limited as long as it can adhere the piezoelectric film 111 to the substrate 120, and may use, for example, an epoxy resin.

The substrate 120 has a small linear expansion coefficient. Therefore, the surface acoustic wave element 100C including the substrate 120 and the piezoelectric film 111 may suppress elongation in the lateral direction (a direction perpendicular to the thickness direction of the piezoelectric film 111) at a high temperature, and thus has excellent temperature stability. By not only the action of the piezoelectric film 111 including the aluminum nitride film having the crystal region that is highly oriented to the c-axis, but also the action of the substrate 120 having the small linear expansion coefficient, it is possible to obtain the surface acoustic wave element 100C having high piezoelectricity and smaller temperature dependence.

(Surface Acoustic Wave Element 100D)

Figure 6:
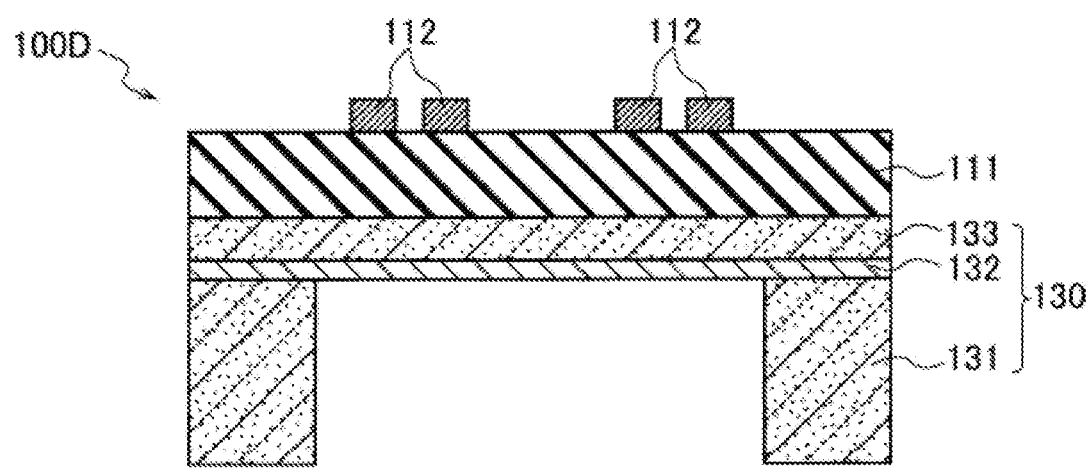
FIG. 6 is a cross-sectional view to explain a surface acoustic wave element 100D according to an embodiment of the present disclosure.

A surface acoustic wave element 100D shown in FIG. 6 includes an SOI substrate 130, a piezoelectric film 111 on the SOI substrate 130, and a comb-shaped electrode 112 on the piezoelectric film 111. A difference between the surface acoustic wave element 100D and the surface acoustic wave element 100A is that the SOI substrate 130 is provided in place of the base substrate 110. Since the surface acoustic wave element 100D includes the piezoelectric film 111 which is a piezoelectric thin film, it is also referred to as a thin film acoustic wave element.

The SOI substrate 130 includes a silicon film 131, a silicon oxide film 132, and an active layer 133 which is silicon (111). The silicon film 131 is formed with an opening, and the back surface of the silicon oxide film 132 is exposed. The opening may be formed by etching the silicon film 131.

The silicon oxide film 132 has a small linear expansion coefficient. Therefore, the surface acoustic wave element 100D including the silicon oxide film 132 has excellent temperature stability.

Like the above-mentioned base substrate 110, the active layer 133 having high crystallinity functions as a seed crystal of the aluminum nitride film, and the seed crystal may be used as a nucleus for crystal growth to form an aluminum nitride film having a crystal region that is highly oriented to the c-axis.

By using the SOI substrate 130, the surface acoustic wave element 100D has excellent temperature stability. By not only the action of the piezoelectric film 111 including the aluminum nitride film having a crystal region that is highly oriented to the c-axis, but also the action of the SOI substrate 130, it is possible to obtain the surface acoustic wave element 100D having high piezoelectricity and smaller temperature dependence.

(Surface Acoustic Wave Element 100E)

Figure 7:
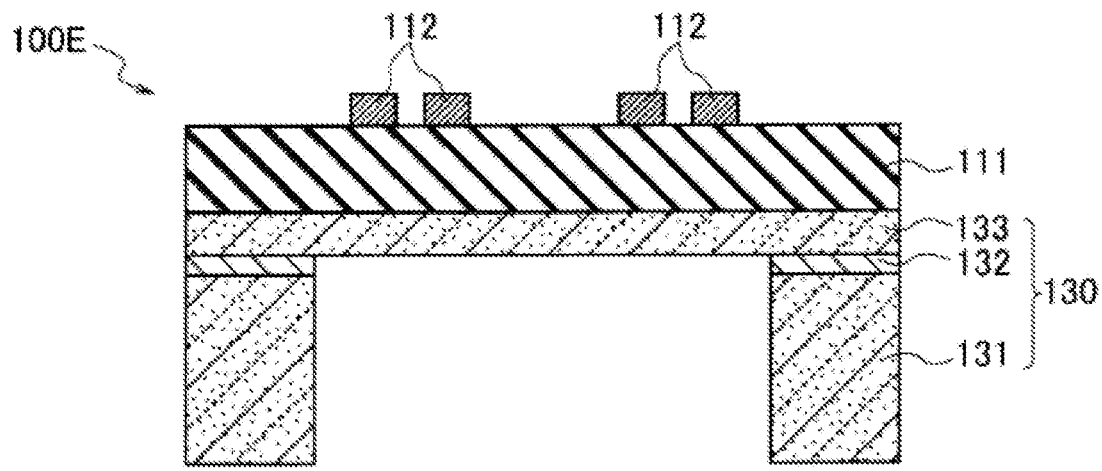
FIG. 7 is a cross-sectional view to explain a surface acoustic wave element 100E according to an embodiment of the present disclosure.

A surface acoustic wave element 100E shown in FIG. 7 includes an SOI substrate 130, a piezoelectric film 111 on the SOI substrate 130, and a comb-shaped electrode 112 on the piezoelectric film 111. A difference between the surface acoustic wave element 100E and the surface acoustic wave element 100D is that the back surface of the active layer 133 in the SOI substrate 130 is exposed. The surface acoustic wave element 100E is a thin film surface acoustic wave element.

Like the surface acoustic wave element 100D, by using the SOI substrate 130, the surface acoustic wave element 100E has excellent temperature stability. By not only the action of the piezoelectric film 111 including the aluminum nitride film having a crystal region that is highly oriented to the c-axis, but also the action of the SOI substrate 130, it is possible to obtain the surface acoustic wave element 100E having high piezoelectricity and smaller temperature dependence.

(Surface Acoustic Wave Element 100F)

Figure 8:
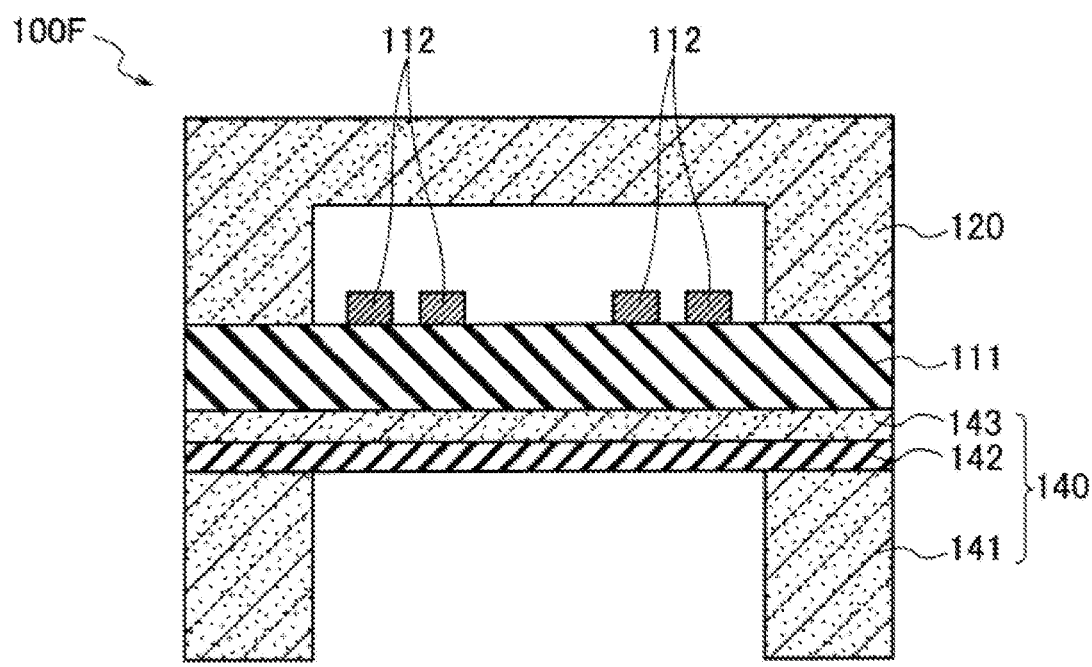
FIG. 8 is a cross-sectional view to explain a surface acoustic wave element 100F according to an embodiment of the present disclosure.

A surface acoustic wave element 100F shown in FIG. 8 includes an SOI substrate 140, a piezoelectric film 111 on the SOI substrate 140, a comb-shaped electrode 112 on the piezoelectric film 111, and a substrate 120 on the piezoelectric film 111. A difference between the surface acoustic wave element 100F and the surface acoustic wave element 100D is that the substrate 120 is provided. The surface acoustic wave element 100E is a thin film acoustic wave element.

The SOI substrate 140 includes a silicon film 141, a silicon oxide film 142, and an active layer 143 which is silicon (111). The description of the silicon film 131, the silicon oxide film 132, and the active layer 133 which is silicon (111) may be invoked for the silicon film 141, the silicon oxide film 142, and the active layer 143 which is silicon (111).

Further, the piezoelectric film 111 and the substrate 120 are adhered to each other and may be adhered to each other by using, for example, the above-mentioned adhesive 114.

Like the surface acoustic wave element 100C and the surface acoustic wave element 100D, by using the substrate 120 and the SOI substrate 140, the surface acoustic wave element 100F has excellent temperature stability. By not only the action of the piezoelectric film 111 including the aluminum nitride film having a crystal region that is highly oriented to the c-axis, but also the action of the substrate 120 and the SOI substrate 130, it is possible to obtain the surface acoustic wave element 100F having high piezoelectricity and smaller temperature dependence.

(Surface Acoustic Wave Element 100G)

Figure 9:
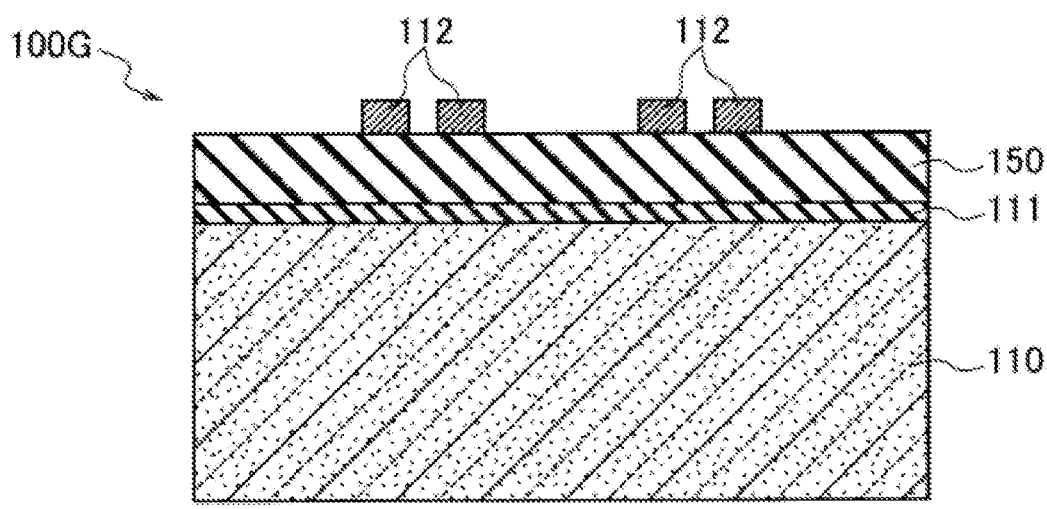
FIG. 9 is a cross-sectional view to explain a surface acoustic wave element 100G according to an embodiment of the present disclosure.

A surface acoustic wave element 100G shown in FIG. 9 includes a base substrate 110, a piezoelectric film 111 on the base substrate 110, a piezoelectric film 150 on the piezoelectric film 111, and a comb-shaped electrode 112 on the piezoelectric film 150. A difference between the surface acoustic wave element 100G and the surface acoustic wave element 100A is that the piezoelectric film 150 is further provided.

The piezoelectric film 150 is an aluminum nitride film containing scandium formed by the sputtering method. For example, the piezoelectric film 150 may be an aluminum nitride film containing 0.5 to 35 atom % of scandium. Since the aluminum nitride film containing scandium has high piezoelectricity, by laminating it with the aluminum nitride film having a crystal region that is highly oriented to the c-axis, it is possible to obtain the surface acoustic wave element 100G having higher piezoelectricity.

(Surface Acoustic Wave Element 100H)

Figure 10:
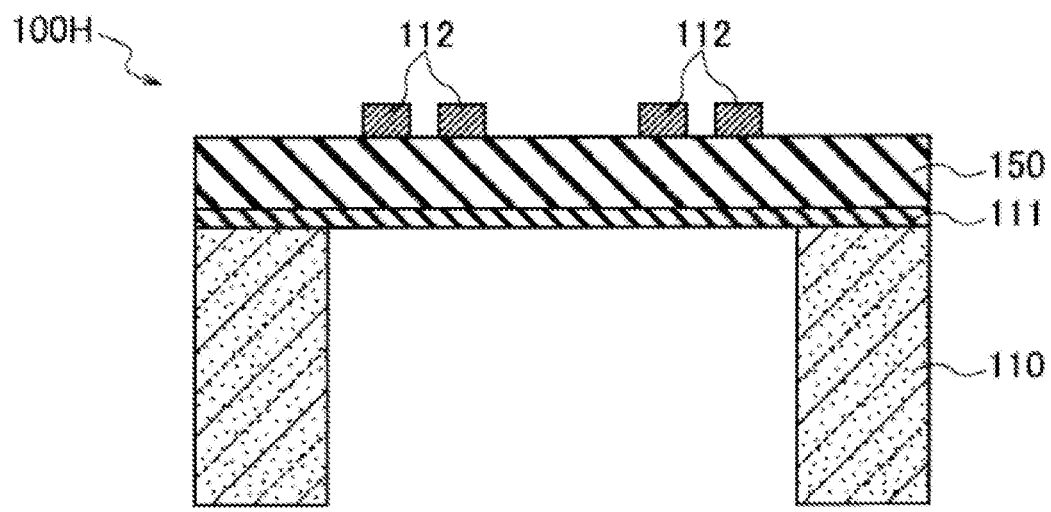
FIG. 10 is a cross-sectional view to explain a surface acoustic wave element 100H according to an embodiment of the present disclosure.

A surface acoustic wave element 100H shown in FIG. 10 includes a base substrate 110, a piezoelectric film 111 on the base substrate 110, a piezoelectric film 150 on the piezoelectric film 111, and a comb-shaped electrode 112 on the piezoelectric film 150. A difference between the surface acoustic wave element 100H and the surface acoustic wave element 100G is that the back surface of the piezoelectric film 111 is exposed.

Like the surface acoustic wave element 100G, a high piezoelectricity may be provided by laminating the aluminum nitride film having a crystal region that is highly oriented to the c-axis with the aluminum nitride film containing scandium, and thus it is possible to obtain the surface acoustic wave element 100H having higher piezoelectricity.

(Piezoelectric Thin Film Resonance Element 200A)

Figure 11:
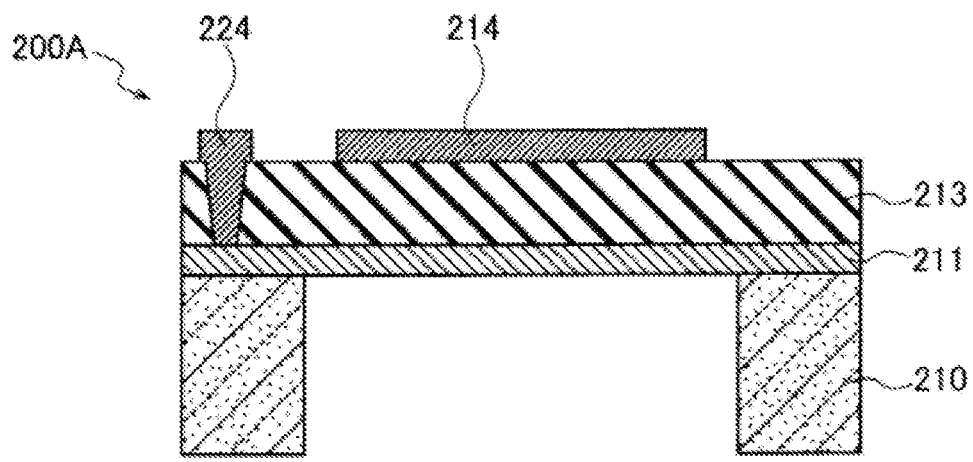
FIG. 11 is a cross-sectional view to explain a piezoelectric thin film resonance element 200A according to an embodiment of the present disclosure.

A piezoelectric thin film resonance element 200A shown in FIG. 11 includes a base substrate 210, a lower electrode 211 on the base substrate 210, a piezoelectric film 213 on the lower electrode 211, and an upper electrode 214 on the piezoelectric film 213. The upper electrode 214 is electrically connected to the lower electrode 211 via a wiring 224. The description of the base substrate described in the above-described surface acoustic wave element may be invoked for the base substrate 210. The piezoelectric film 213 includes an aluminum nitride film having a crystal region that is highly oriented to the c-axis. The base substrate 210 having high crystallinity functions as a seed crystal of the aluminum nitride film, and the seed crystal may be used as a nucleus for crystal growth to form an aluminum nitride film having a crystal region that is highly oriented to the c-axis. The description of the piezoelectric film 11 may be invoked for details of physical characteristics of the piezoelectric film 213, a method of forming the piezoelectric film 213, and the like.

The description of the lower electrode 22 may be invoked for the lower electrode 211. In the piezoelectric thin film resonance element 200A, the lower electrode 211 containing silicon may be used. For example, a silicon substrate obtained by a high-concentration doping to give conductivity may be used as the lower electrode 211. The description of the upper electrode 24 may be invoked for the upper electrode 214.

The lower electrode 211 has a small linear expansion coefficient. Therefore, the piezoelectric thin film resonance element 200A including the lower electrode 211 and the piezoelectric film 213 has excellent temperature stability. By not only the action of the piezoelectric film 213 including the aluminum nitride film having a crystal region that is highly oriented to the c-axis, but also the action of the lower electrode 211 having a small linear expansion coefficient, it is possible to obtain the piezoelectric thin film resonance element 200A having high piezoelectricity and smaller temperature dependence.

(Piezoelectric Thin Film Resonance Element 200B)

Figure 12:
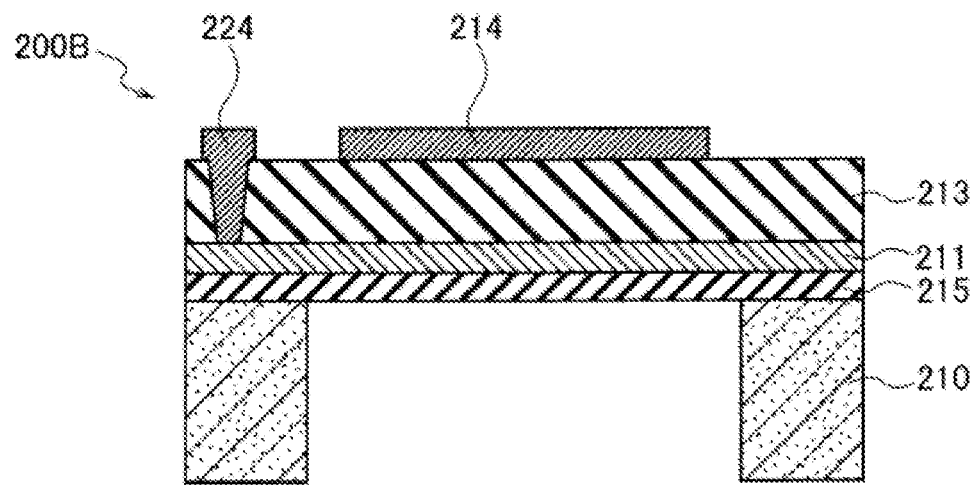
FIG. 12 is a cross-sectional view to explain a piezoelectric thin film resonance element 200B according to an embodiment of the present disclosure.

A piezoelectric thin film resonance element 200B shown in FIG. 12 includes a base substrate 210, a silicon oxide film 215 on the base substrate 210, a lower electrode 211 on the silicon oxide film 215, a piezoelectric film 213 on the lower electrode 211, and an upper electrode 214 on the piezoelectric film 213. A difference between the piezoelectric thin film resonance element 200B and the piezoelectric thin film resonance element 200A is that the silicon oxide film 215 is provided.

The silicon oxide film 215 has a small linear expansion coefficient. Therefore, the piezoelectric thin film resonance element 200B including the silicon oxide film 215 and the piezoelectric film 213 has excellent temperature stability. By not only the action of the piezoelectric film 213 including the aluminum nitride film having a crystal region that is highly oriented to the c-axis, but also the action of the silicon oxide film 215 having a small linear expansion coefficient, it is possible to obtain the piezoelectric thin film resonance element 200B having high piezoelectricity and smaller temperature dependence.

(Piezoelectric Thin Film Resonance Element 200C)

Figure 13:
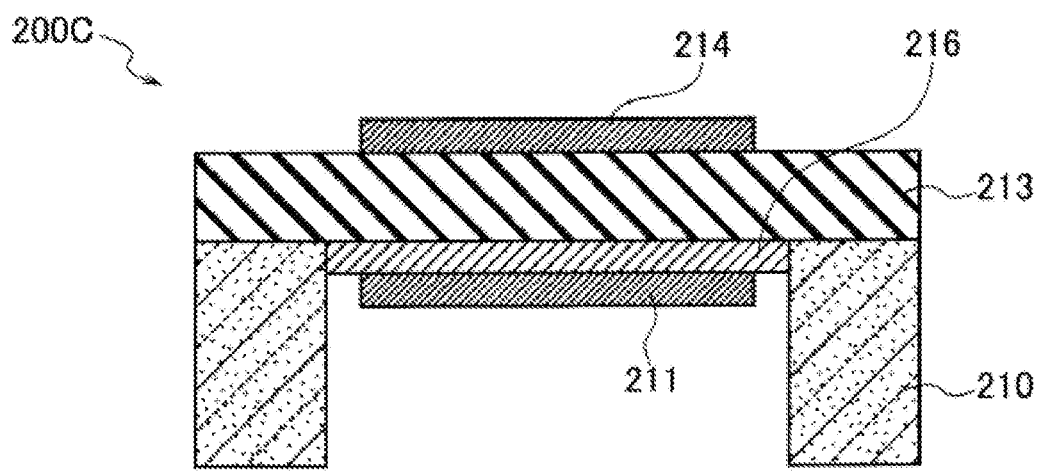
FIG. 13 is a cross-sectional view to explain a piezoelectric thin film resonance element 200C according to an embodiment of the present disclosure.

A piezoelectric thin film resonance element 200C shown in FIG. 13 includes a base substrate 210, a lower electrode 211, a piezoelectric film 213, an upper electrode 214, and a silicon oxide film 216. A difference between the piezoelectric thin film resonance element 200C and the piezoelectric thin film resonance element 200A is that the silicon oxide film 216 is provided. That is, the difference is that the silicon oxide film 216 is sandwiched between the lower electrode 211 and the upper electrode 214.

The silicon oxide film 216 has a small linear expansion coefficient. Therefore, the piezoelectric thin film resonance element 200C including the silicon oxide film 216 and the piezoelectric film 213 has excellent temperature stability. By not only the action of the piezoelectric film 213 including the aluminum nitride film having a crystal region that is highly oriented to the c-axis, but also the action of the silicon oxide film 216 having a small linear expansion coefficient, it is possible to obtain the piezoelectric thin film resonance element 200C having high piezoelectricity and smaller temperature dependence.

(Piezoelectric Thin Film Resonance Element 200D)

Figure 14:
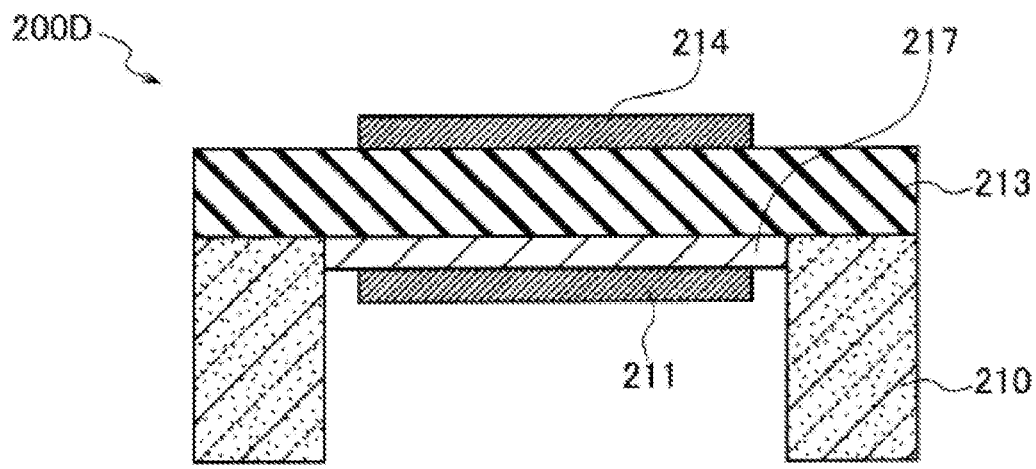
FIG. 14 is a cross-sectional view to explain a piezoelectric thin film resonance element 200D according to an embodiment of the present disclosure.

A piezoelectric thin film resonance element 200D shown in FIG. 14 includes a base substrate 210, a lower electrode 211, a piezoelectric film 213, an upper electrode 214, and a silicon film 217. A difference between the piezoelectric thin film resonance element 200D and the piezoelectric thin film resonance element 200C is that the silicon film 217 is provided in place of the silicon oxide film 216.

Like the above-mentioned base substrate 210, the silicon film 217 functions as a seed crystal of the aluminum nitride film, and the seed crystal may be used as a nucleus for crystal growth to form an aluminum nitride film having a crystal region that is highly oriented to the c-axis. By the action of the piezoelectric film 213 including the aluminum nitride film having the crystal region that is highly oriented to the c-axis, it is possible to obtain the piezoelectric thin film resonance element 200D having high piezoelectricity and small temperature dependence.

(Piezoelectric Thin Film Resonance Element 200E)

Figure 15:
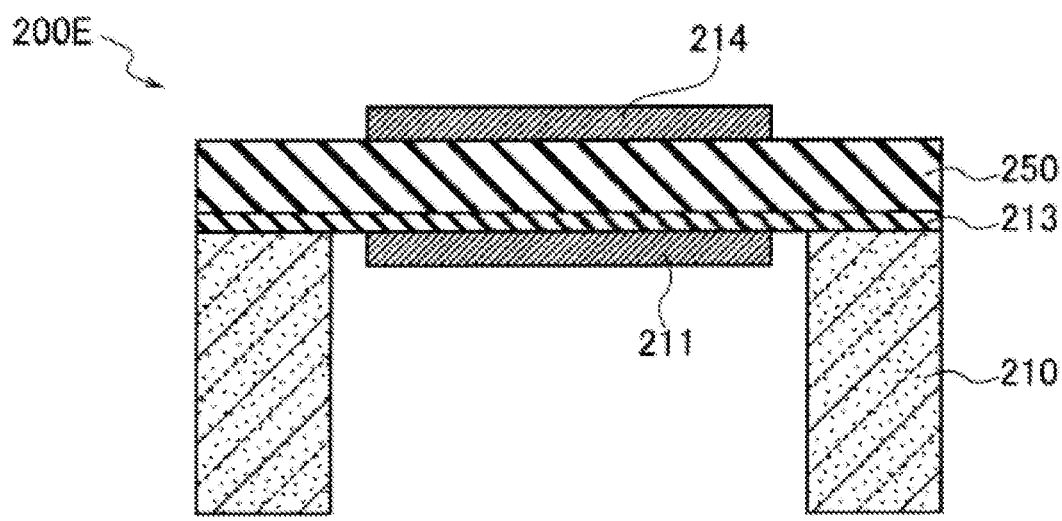
FIG. 15 is a cross-sectional view to explain a piezoelectric thin film resonance element 200E according to an embodiment of the present disclosure.

A piezoelectric thin film resonance element 200E shown in FIG. 15 includes a base substrate 210, a piezoelectric film 213 on the base substrate 210, a piezoelectric film 250 on the piezoelectric film 213, a lower electrode 211, and an upper electrode 214. A difference between the piezoelectric thin film resonance element 200E and the piezoelectric thin film resonance element 200C is that the piezoelectric film 250 is provided in place of the silicon oxide film 216.

The piezoelectric film 250 is an aluminum nitride film containing scandium formed by the sputtering method. For example, the piezoelectric film 250 may be an aluminum nitride film containing 0.5 to 35 atom % of scandium. Since the aluminum nitride film containing scandium has high piezoelectricity, high piezoelectricity may be provided by laminating it with the aluminum nitride film having a crystal region that is highly oriented to the c-axis, and thus, it is possible to obtain the piezoelectric thin film resonance element 200E having higher piezoelectricity.

Examples

Hereinafter, the embodiment of the present disclosure will be described in more detail by way of an Example, but the embodiment of the present disclosure is not limited to the following Example.

A method for manufacturing a piezoelectric film used in this Example is shown below.

A silicon (111) substrate as a base substrate is provided, and an aluminum nitride film as a piezoelectric film is formed on the silicon (111) substrate by a MOCVD method. A film-forming condition is as follows.

Base substrate temperature: 1,050 degrees C.
Film-forming chamber pressure: 13 kPa
Precursor gas: TMA and ammonia
Carrier gas: nitrogen gas and hydrogen gas
Film formation rate: 8.7 nm/min
V/III flow rate ratio: 251

Aluminum nitride films, which are four types of Samples with different film thicknesses, are formed under the above-mentioned film-forming condition. A film thickness of the formed aluminum nitride film of Sample 1 is 34.4 nm, a film thickness of the aluminum nitride film of Sample 2 is 69.3 nm, a film thickness of the aluminum nitride film of Sample 3 is 105.0 nm, and a film thickness of the aluminum nitride film of Sample 4 is 196.0 nm.

In addition, Sample 5 in which a gallium nitride film is formed on the aluminum nitride film of Sample 4 is also provided. A film-forming condition for the gallium nitride film is as follows.

Base substrate temperature: 1,050 degrees C.
Film-forming chamber pressure: 13 kPa
Precursor gas: TMG and ammonia
Carrier gas: nitrogen gas and hydrogen gas
Film formation rate: 43 nm/min
V/III flow rate ratio: 2,300

Next, X-ray diffraction (XRD) is performed on Samples 1 to 5 to evaluate the crystal state. The XRD used is one manufactured by Malvern Panalytical Company. A condition is that in ω scanning, a scanning range is 5 degrees (measured at ±2.5 degrees centered at the angle at which the maximum value is obtained), and a step width is 0.01 degrees, and a scanning speed is 1.5 degrees/min.

Figure 16:
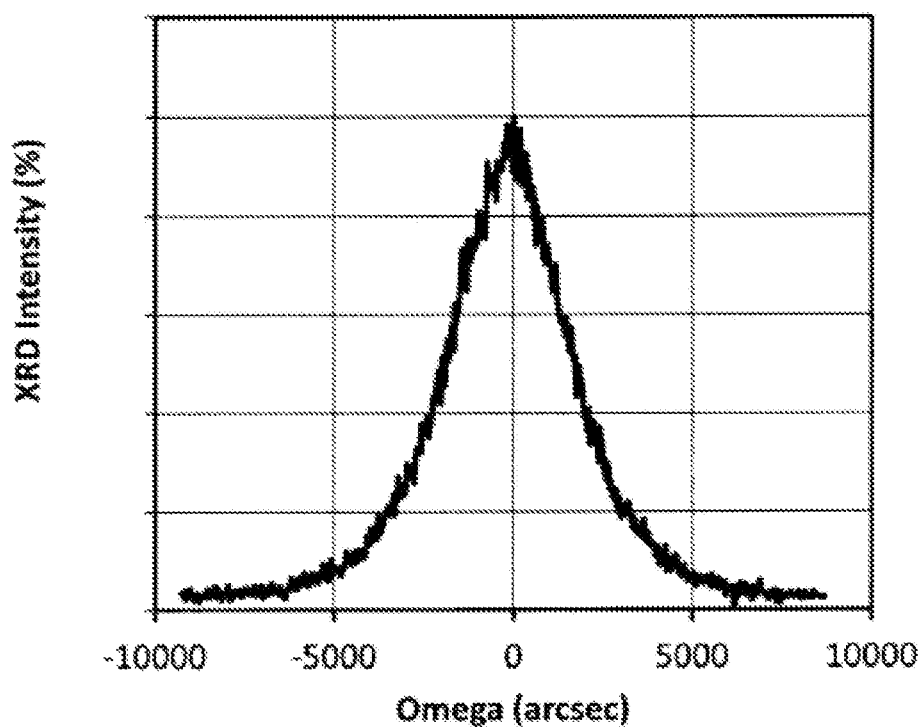
FIG. 16 is a graph showing an XRD spectrum at the (002) diffraction peak of Sample 1 in an Example.
Figure 17:
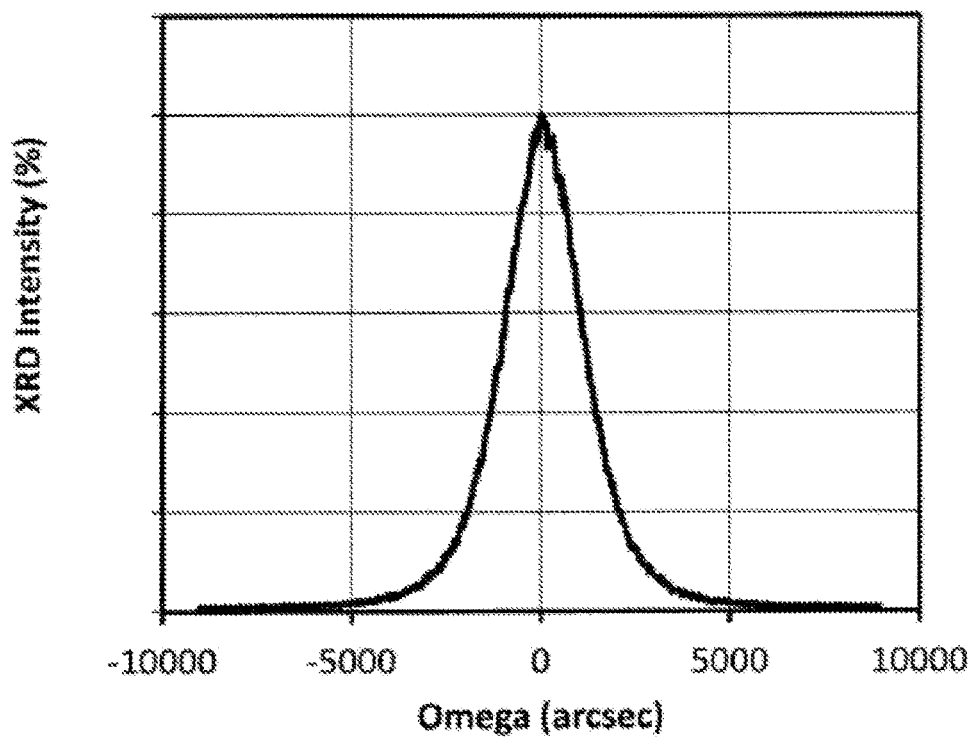
FIG. 17 is a graph showing an XRD spectrum at the (002) diffraction peak of Sample 2 in an Example.
Figure 18:
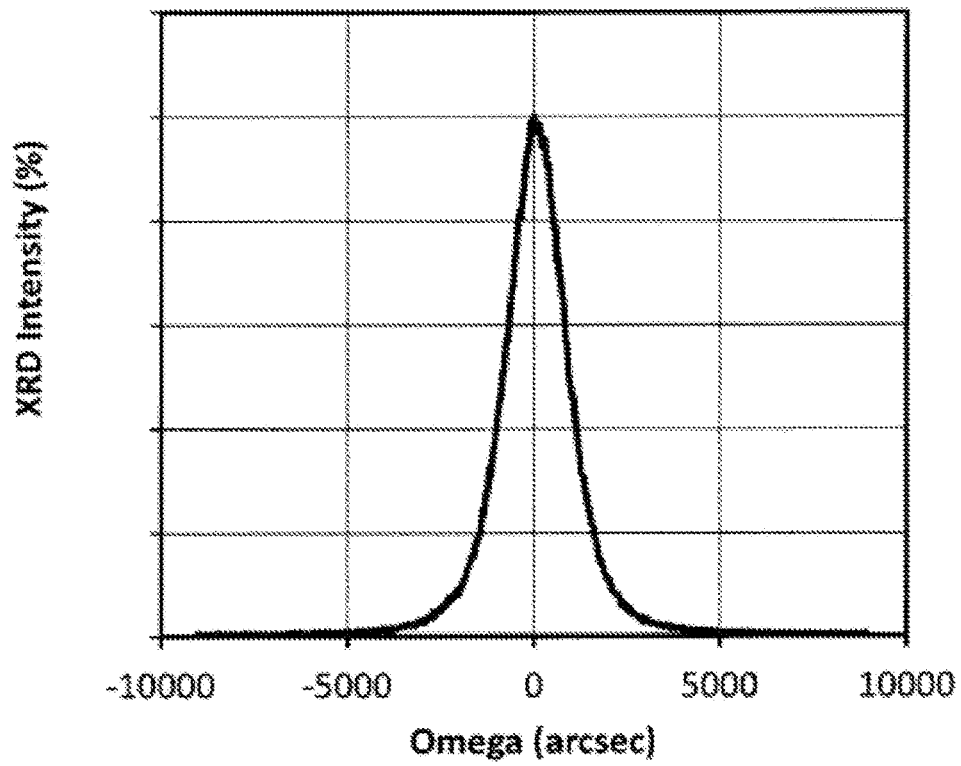
FIG. 18 is a graph showing an XRD spectrum at the (002) diffraction peak of Sample 3 in the Example.
Figure 19:
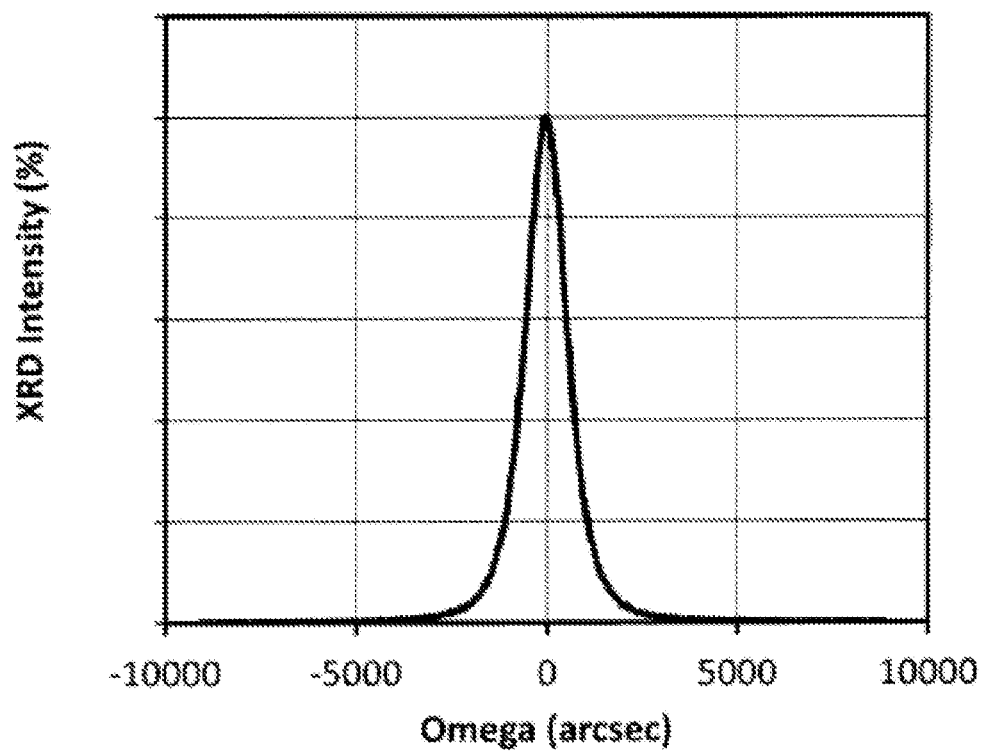
FIG. 19 is a graph showing an XRD spectrum at the (002) diffraction peak of Sample 4 in the Example.
Figure 20:
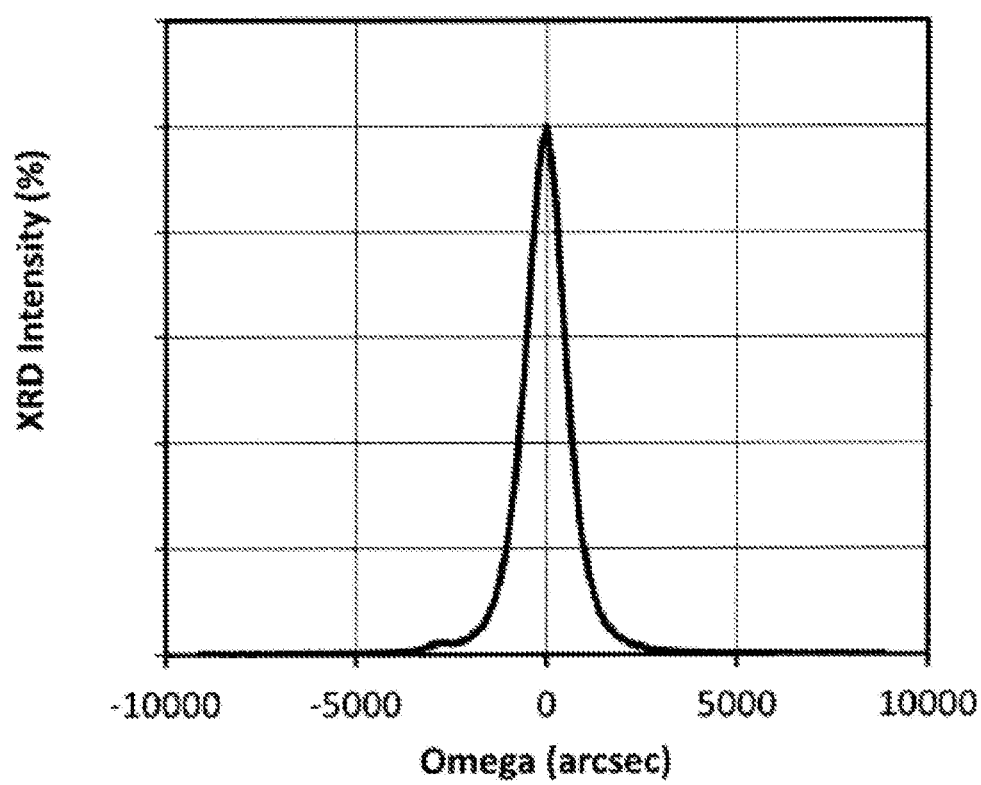
FIG. 20 is a graph showing an XRD spectrum at the (002) diffraction peak of Sample 5 in the Example.

FIG. 16 shows an XRD spectrum at (002) diffraction peak of Sample 1, FIG. 17 shows an XRD spectrum at (002) diffraction peak of Sample 2, FIG. 18 shows an XRD spectrum at (002) diffraction peak of Sample 3, FIG. 19 shows an XRD spectrum at (002) diffraction peak of Sample 4, and FIG. 20 shows an XRD spectrum at (002) diffraction peak of Sample 5, respectively. In FIGS. 16 to 20, the vertical axis represents XRD integrity (%) and the horizontal axis represents Omega (arcsec).

From FIG. 16, an FWHM at (002) diffraction peak of Sample 1 was 1.007 degrees. From FIG. 17, an FWHM at (002) diffraction peak of Sample 2 was 0.641 degrees. From FIG. 18, an FWHM at (002) diffraction peak of Sample 3 was 0.493 degrees. From FIG. 19, an FWHM at (002) diffraction peak of Sample 4 was 0.353 degrees. From FIG. 20, an FWHM at (002) diffraction peak of sample 5 was 0.334 degrees.

From FIGS. 16 to 19, when the film thickness of the aluminum nitride film is equal to or larger than the film thickness of the aluminum nitride film of Sample 2, for example, 70 nm or more, the XRD spectrum at (002) diffraction peak has a sharp peak shape, and the FWHM at the (002) diffraction peak also becomes smaller than 1.00 degree. Further, when the film thickness of the aluminum nitride film is 100 nm or more, the XRD spectrum at the (002) diffraction peak has a sharper peak shape, and the FWHM at (002) diffraction peak also becomes smaller than 0.50 degrees.

Further, as shown in FIG. 20, in Sample 5 in which the gallium nitride film is formed on the aluminum nitride film, the XRD spectrum at (002) diffraction peak has a sharper peak shape due to the action of the gallium nitride film, and the FWHM at (002) diffraction peak also becomes smaller.

According to the present disclosure in some embodiments, it is possible to provide a high-performance piezoelectric element that operates stably in a high-frequency region, has high piezoelectricity, and has small temperature dependence. Further, it is possible to provide a surface acoustic wave element including the piezoelectric element. Further, it is possible to provide a piezoelectric thin film resonance element including the piezoelectric element. Further, it is possible to provide a method of manufacturing the piezoelectric element.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A piezoelectric element comprising:
   a piezoelectric film,
   wherein the piezoelectric film is a laminated film including a first thin film and a highly c-axis oriented aluminum nitride film that is laminated to the first thin film,
   wherein a full width at half maximum of a (002) diffraction peak of the aluminum nitride film is smaller than 1.00 degree, and
   wherein the first thin film is a thin film having a negative linear expansion coefficient.

2. The piezoelectric element of claim 1, further comprising
   a base substrate,
   wherein the piezoelectric film is arranged on the base substrate.

3. The piezoelectric element of claim 2, wherein the base substrate is one selected from the group of a silicon (111) substrate, an SOI substrate in which an active layer is silicon (111), a SiC substrate, and a sapphire substrate.

4. The piezoelectric element of claim 1, wherein the full width at half maximum at (002) diffraction peak of the aluminum nitride film is smaller than 0.36 degrees.

5. The piezoelectric element of claim 1, wherein a film thickness of the aluminum nitride film is 70 nm or more.

6. The piezoelectric element of claim 1, wherein a film thickness of the aluminum nitride film is 100 nm or more.

7. The piezoelectric element of claim 1, wherein the piezoelectric film further includes a second thin film, and
   wherein the second thin film is at least one selected from the group of a gallium nitride film, an aluminum gallium nitride film, and an aluminum nitride film containing scandium.

8. A surface acoustic wave element comprising the piezoelectric element of claim 1.

9. A piezoelectric thin film resonance element comprising the piezoelectric element of claim 1.

10. A method of manufacturing a piezoelectric element, comprising:
    forming a piezoelectric film, which is a laminated film including a first thin film and a highly c-axis oriented aluminum nitride film that is laminated to the first thin film, on a base substrate,
    wherein the aluminum nitride film is formed by one selected from the group of a CVD method and an MBE method,
    wherein a full width at half maximum of a (002) diffraction peak of the aluminum nitride film is smaller than 1.00 degree, and
    wherein the first thin film is a thin film having a negative linear expansion coefficient.

11. The method of claim 10, wherein the base substrate is one selected from the group of a silicon (111) substrate, an SOI substrate in which an active layer is silicon (111), a SiC substrate, and a sapphire substrate.

12. The method of claim 10, wherein the aluminum nitride film is formed by a MOCVD method.

13. The method of claim 12, wherein the aluminum nitride film is formed by the MOCVD method in which trimethylaluminum and ammonia are used, the base substrate is set at 900 to 1,100 degrees C., and a pressure at the time of film formation is 10 to 15 kPa.

14. The method of claim 10, wherein the full width at half maximum at (002) diffraction peak of the aluminum nitride film is smaller than 0.36 degrees.

15. The method of claim 10, wherein a film thickness of the aluminum nitride film is 70 nm or more.

16. The method of claim 10, wherein a film thickness of the aluminum nitride film is 100 nm or more.

17. The method of claim 10, wherein the piezoelectric film further includes a second thin film, and
    wherein the second thin film is at least one selected from the group of a gallium nitride film, an aluminum gallium nitride film, and an aluminum nitride film containing scandium.

18. The method of claim 10, wherein the base substrate is peeled off by at least one selected from the group of etching, grinding, and polishing.

* * * * *